US005486781A

United States Patent [19]

Im

[11] Patent Number: 5,486,781

[45] Date of Patent: Jan. 23, 1996

[54] BASE CURRENT-CONTROL CIRCUIT OF AN OUTPUT TRANSISTOR

[75] Inventor: Changsik Im, Kyungki-do, Rep. of Korea

[73] Assignee: Samsung Electronics Co., Ltd., Suwon, Rep. of Korea

[21] Appl. No.: 187,038

[22] Filed: Jan. 27, 1994

[30] Foreign Application Priority Data

Jan. 27, 1993 [KR] Rep. of Korea ........................ 1003/93

[51] Int. Cl.[6] ........................... H03K 17/16; H03K 17/60

[52] U.S. Cl. .......................... 327/108; 327/312; 327/478; 327/538

[58] Field of Search .................................... 307/359, 358, 307/255, 253, 270; 327/108, 109, 110, 111, 312, 379, 478, 538, 545

[56] References Cited

U.S. PATENT DOCUMENTS

| | | | |
|---|---|---|---|
| 4,213,068 | 7/1980 | Ahmed | 307/255 |
| 4,952,827 | 8/1990 | Leipold et al. | 307/270 |
| 5,021,687 | 6/1991 | Yarbrough et al. | 307/359 |
| 5,271,399 | 12/1993 | Tihanyi et al. | 307/270 |
| 5,272,392 | 12/1993 | Wong et al. | 307/270 |

*Primary Examiner*—Timothy P. Callahan
*Assistant Examiner*—Terry L. Englund
*Attorney, Agent, or Firm*—Cushman Darby & Cushman

[57] ABSTRACT

A base current-control circuit comprises a detector for detecting a load current of the output transistor and for enabling the circuit to generate a detected current proportional to the load current. A base current-control voltage generator generates a voltage as a function of the detected current, and a switch generates ON/OFF signals. A base current generator utilizes the voltage to generate a base current in response to the ON/OFF signals generated by the switch to drive the output transistor.

12 Claims, 2 Drawing Sheets

BASE CURRENT-CONTROL CIRCUIT OF AN OUTPUT TRANSISTOR

This application has priority rights based on South Korean application No. 1003/93 filed Jan. 27, 1993, which South Korean application is hereby incorporated by reference.

BACKGROUND OF THE INVENTION

1. Field Of the Invention

The present invention relates to a base current-control circuit, of an output transistor. More particularly, this invention relates to a base current-control circuit which changes the base current of the output transistor as a function of the load current of the output transistor in order to maximize power consumption efficiency.

2. Description of the Prior Art

Typical electronic equipment for processing input signals generally has an output transistor for driving an external device. The output transistor is designed to carry large currents and supplies current from its collector to a load. The current supply from the collector is controlled by the base current.

FIG. 1. shows an output terminal of a typical piece of electronic equipment which comprises an output transistor $Q_{out}$, a load $R_L$, and a source of electric power $V_{cc}$. When the input signal processed by the electronic equipment triggers a switching transistor $Q_{SW}$, the switching transistor is alternately turned off and on. When the switching transistor $Q_{SW}$ is turned on, the output transistor is turned on. When the switching transistor $Q_{SW}$ is turned off, the output transistor is turned off. More specifically, when the switching transistor is turned on, a diode $D_1$ connecting a transistor base with the collector of the $Q_{SW}$ transistor is also turned on, and a constant-voltage source loads a resistance $R_b$ with a voltage $V_{ref}$. As shown in FIG. 1, node A is at a voltage $V_A$, which is equal to the total of $V_{ref}$ and a diode voltage $V_{D1}$. At the same time, node B is at a voltage $V_B$, which is equal to node voltage $V_A$ minus the voltage ($V_{BE,\ Q1}$) between the base and emitter of transistor $Q_1$. Thus, $V_B$ is equal to $V_{ref}+V_{D1}-V_{BE,Q1}$, and if $V_{D1}$ is equal to $V_{BE,\ Q1}$, $V_S$ can be $V_{ref}$.

The collector current of transistor $Q_1$, which also functions as base current: $I_B$ for output transistor $Q_{out}$, is equal to the node voltage $V_B$ divided by the load resistance across resistor $R_b$ (i.e., $V_B/R_b$). This is the same as $V_{ref}/R_b$, and $I_B$ is constant. Therefore, $I_B$ is determined by the resistance $R_b$ and a constant voltage, and is unrelated to the magnitude of load resistance $R_L$ across the output transistor $Q_{out}$. Thus, regardless of the load current $I_o$, an invariable base current $I_B$ is utilized. As a result, excessive electric power is dissipated unnecessarily. However, it can be appreciated that if the base current $I_B$ were controlled as a function of the magnitude of the load current $I_o$, electric power would be used more efficiently.

SUMMARY OF THE INVENTION

The present invention is directed to a base current-control circuit of an output transistor, and more specifically, one which maximizes electric power consumption efficiency.

The base current-control circuit of the present invention controls a base current of the output transistor as a function of the load current of the output transistor. The base current-control circuit comprises a detector for detecting a load current of the output transistor and for enabling the circuit to generate a detected current proportional to the load current; a base current-control voltage generator for generating a voltage as a function of the detected current proportional to the load current;a switch for generating ON/OFF signals; and a base current generator for utilizing the voltage to generate a base current in response to the ON/OFF signals generated by the switch to drive the output transistor.

DETAILED DESCRIPTION OF THE PREFERRED EMBODIMENT

The base current $I_B$ of the output transistor of the present invention varies as a simple linear function of the load current $I_o$. Thus, the load current, which is an independent variable, determines the base current. Otherwise put, the load current controls the base current.

Figure 1:
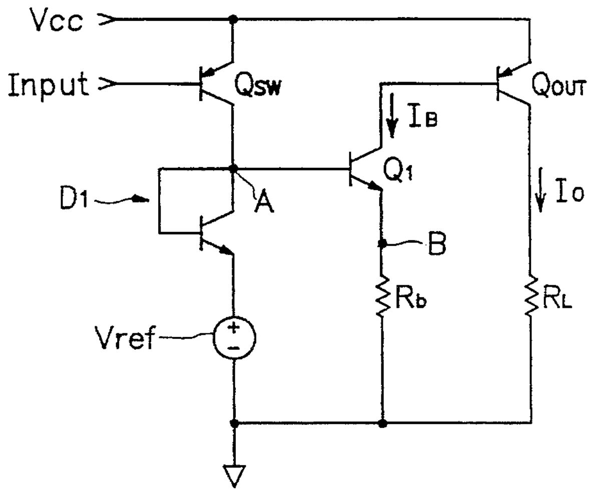
FIG. 1 (Prior Art)
FIG. 1 is a circuit diagram illustrating an output terminal of a typical piece of electronic equipment in prior art.
Figure 2:
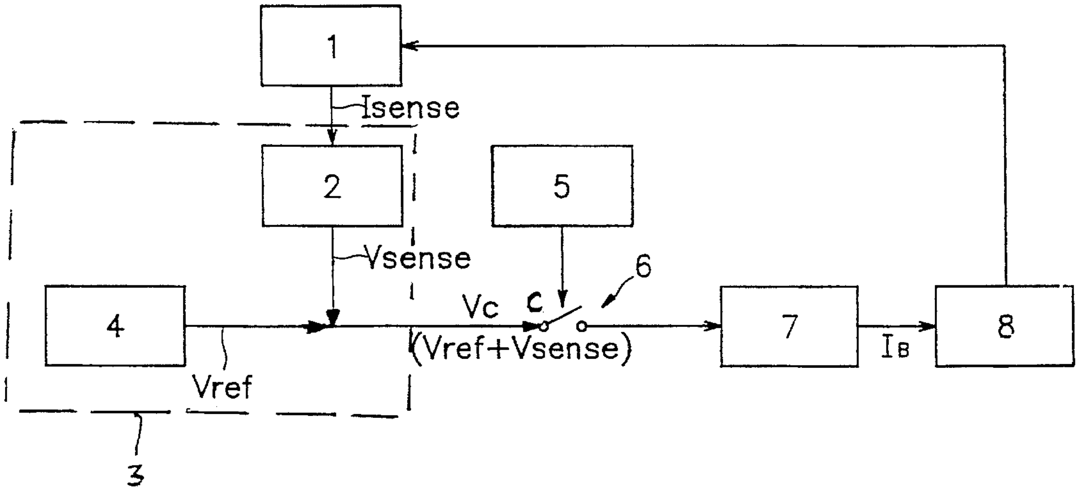
FIG. 2 is a block diagram illustrating the present invention.
Figure 3:
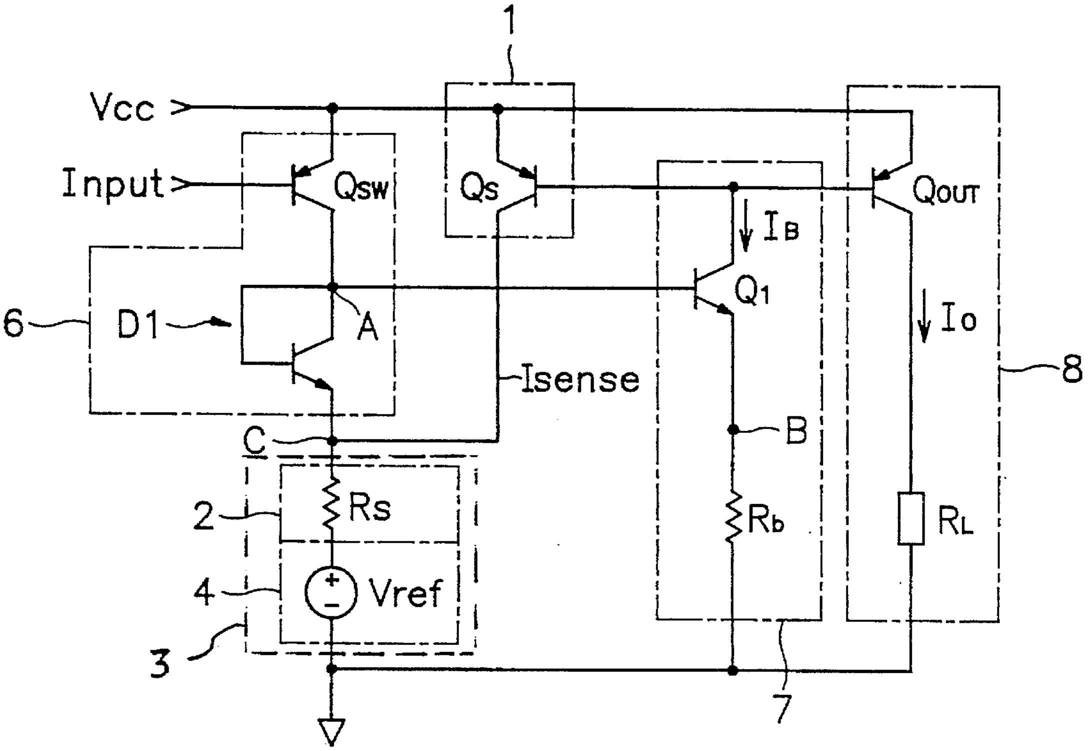
FIG. 3 snows an embodiment of the present invention.

Referring to FIGS. 2 and 3, the load current $I_o$ of a driving terminal 8, which preferably includes output transistor $Q_{out}$, is proportional to current $I_{sense}$ as detected by a load current detector 1. A current-voltage converter 2 converts the detected current $I_{sense}$ to a proportional voltage $V_{sense}$. A constant-voltage source 4 outputs voltage $V_{ref}$, and both $V_{ref}$ and $V_{sense}$ from the output of to a base current-control voltage generator 3. The base current-control voltage generator 3 outputs the base current-control voltage $V_c$ (equal to $V_{ref}+V_{sense}$), which is then input to a switch 6. Thus, it can be appreciated that voltage generator 3 basically comprises constant-voltage source 4 and converter 2. When a signal from an output transistor ON/OFF controller 5 is then input to the switch 6, the base current-control voltage flows into a base current generator 7 through the switch. The base current generator 7 then inputs the controlled base current $I_B$ to the output transistor of driving terminal 8. It can thus be appreciated that the base current $I_B$ is controlled by the load current.

In FIG. 3 it can be seen that transistor $Q_S$ is set up in parallel with output transistor $Q_{out}$ in order to detect the load current from the driving terminal 8. The output transistor $Q_{out}$ and transistor $Q_S$ for detecting the load current are both of the PNP type.

The detecting current $I_{sense}$ is determined by the ratio of the emitter areas between the transistor $Q_S$ and the output transistor $Q_{out}$. That is, when the emitter area of $Q_S$ is divided by the emitter area of $Q_{out}$, the result is ,equal to a constant K, and $I_{sense}$ is equal to $K \times I_o$. Since K is fixed, $I_{sense}$ changes proportionally to $I_o$.

$V_{be,QS}$, which is the voltage between the base and the emitter of the transistor $Q_S$, is equal to $V_{be,Qout}$, which is the voltage between the base and the emitter of the output transistor $Q_{out}$.

Thus, the following conditions are met:

$$V_{be},\ Q_S = V_{be},\ Q_{out}$$

-continued $$V_T \ln \frac{I_{c,Q_s}}{I_s \times K} = V_T \ln \frac{I_{c,Q_{out}}}{I_s}$$

Here $V_T$ is the transistor thermal voltage, $I_S$ is a saturation current, and K is equal to the emitter area of $Q_S$ divided by the emitter area of $Q_{out}$. Therefore, the collector current of $I_{C,GS}$ of transistor $Q_s$ is equal to $K \times I_{c,Q_{out}}$. K has a range between 1/100 to 1/1000.

Current-voltage converter 2 converts the detected load current $I_{sense}$ to an equivalent voltage. In the disclosed embodiment, resistor Rs operates as the converter. The detected load current $I_{sense}$ flows into the resistor $R_S$, which causes a voltage drop $V_{sense}$. The size of the voltage drop is proportional to the size of the inflow current. That is, the detected voltage $V_{sense}$ is equal to $I_{sense} \times R_S$.

Referring to FIG. 2, the base current-control voltage generator 3 receives the detected voltage $V_{sense}$ and reference voltage $V_{ref}$, and then outputs the base current-control voltage $V_c$, which is applied to node C. Reference voltage $V_{ref}$ in series with resistor $R_S$, is added to the voltage across resistance $R_S$ to form the total voltage at node C. In the absence of a load, reference voltage $V_{ref}$ is the base current-control voltage $V_c$ of the output transistor.

As shown in the circuit, $V_{ref}$ is fixed, and since $V_c = V_{ref} + V_{sense}$, it is also true that $V_c = V_{ref} + I_S \times R_S$ and that $V_c = V_{ref} + K \times I_o \times R_S$. It can be appreciated, therefore, that. $V_c$ is a simple linear function of $I_o$. Base current-control voltage $V_c$ varies in proportion to $I_{sense}$.

Referring to FIG. 2, it can be seen that base current-control voltage $V_c$ is input to switch 6. The input signal is output from the output transistor ON/OFF controller 5 forming part of the electronic equipment. The switching transistor $Q_{sw}$ turns ON or OFF in accordance with these signals. When the switching transistor is turned on, base current-control voltage $V_c$ flows into NPN type transistor $Q_1$, which functions as a buffer, and the base current-control voltage appears across resistor $R_b$ connected to the emitter of $Q_1$. Thus, base current shows $I_B$ can be expressed as $V_c/R_b$, or alternatively, equation 1 as follows.

$$I_B = \frac{V_{ref} + K \times I_o \times R_s}{R_b} = \frac{V_{ref}}{R_b} + \frac{K + R_s}{R_b} \times I_o \quad (1)$$

The base current generator 7 of FIG. 2 can be embodied in the transistor $Q_1$ as shown in FIG. 3. A collector current of the transistor $Q_1$, which is equal to the base current $I_B$ of the output transistor, is controlled by $I_o$, as expressed by equation 1. The voltage at node B is the sum of $V_{ref}$ and $K \times I_o \times R_S$.

Figure 4:
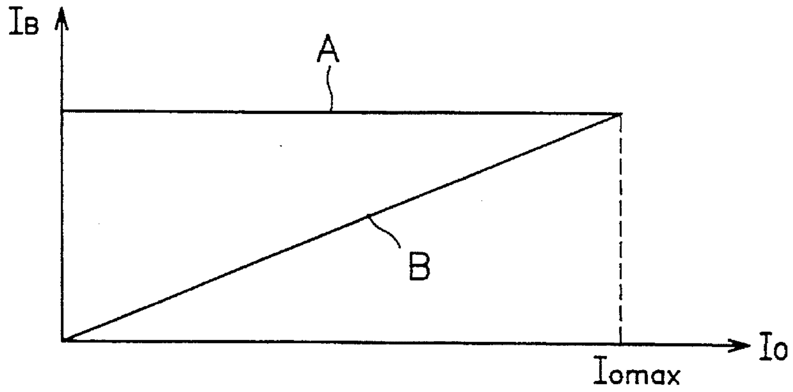
FIG. 4 is a graph showing the operational characteristics of the present invention in comparison to the prior art.

FIG. 4 is a graph which shows the operational characteristics of the circuit of the present invention in comparison with the prior art. The vertical and horizontal axes plot the magnitude of the base current $I_B$ versus the load current $I_o$. In the prior art, as shown by graph line A, the base current $I_B$ is constant regardless of the load current $I_o$. In contrast, in the present invention, and as expressed by equation 1, the graph line B indicates that the base current $I_B$ is dependent upon the load current $I_O$.

In sum the output current is related to the load, which receives driving power from a suitable amount of base current $I_B$. Thus, if the base current in the prior art and the present invention are $I_{B1}$ and $I_{B2}$ respectively, for voltage $V_{cc}$ and load current $I_o$, the power consumption of the present invention can be reduced by as much as $(I_{B1} - I_{B2}) \times V_{cc}$.

What is claimed is:

1. A base current-control circuit of an output transistor comprising:

a detector for detecting an output load current of said output transistor and for enabling the circuit to generate a detected current in constant proportion to said output load current;

a base current-control voltage generator for generating a voltage as a function of said detected current in constant proportion to said output load current;

a switch for generating ON/OFF signals;

a reference voltage generator for generating a reference voltage; and a base current generator for utilizing, said voltage generated by said base current-control voltage generator in constant proportion to said output load current and said reference voltage to generate a base current for input to said output transistor as a function of the output load current in response to said ON/OFF signals.

2. The circuit of claim 1, wherein the detector comprises a detecting transistor which is of the same type as said output transistor and is disposed in parallel with the output transistor.

3. The circuit of claim 1, wherein the base current-control voltage generator comprises a resistor, said resistor being disposed in series with said reference voltage generator.

4. The circuit of claim 1, wherein the base current generator comprises a transistor having a resistor connected to its emitter and satisfies the condition:

$$I_B = \frac{V_{ref} + V_{sense}}{R_b},$$

wherein $I_B$ is the base current of said output transistor, $V_{ref}$ is the reference voltage, $V_{sense}$ is the voltage in constant proportion to the output load current, and $R_b$ is a resistance across the resistor.

5. The circuit of claim 4, wherein the current through said resistor is equal to the base current used to drive said output transistor and is a linear function of the output load current of said output transistor.

6. The circuit of claim 2, wherein the magnitude of the detected current is equal to the the ratio of the emitter area of the detecting transistor to the emitter area of the output transistor multiplied by the output load current.

7. The circuit of claim 1, wherein said base current-control voltage generator comprises:

a current-voltage converter for converting said detected current to a proportional detected voltage; and said voltage generated by said base current-control voltage generator being equal to the sum of said detected voltage and said reference voltage.

8. The circuit of claim 1, wherein said switch comprises a switching transistor.

9. An output driving terminal circuit for electronic equipment and capable of outputting signals through a driving terminal comprising:

an output transistor for supplying a driving current to a load;

a detector for detecting output load current of said output transistor and for enabling the generation of a detected current in constant proportion to said output load current;

a current-voltage converter for converting said detected current to a constantly proportional detected voltage;

a control signal generator for using said detected voltage and a reference voltage to generate a base current control voltage;

a switching transistor for generating ON/OFF input signals; and a base current generator for generating a base current as a function of said ON/OFF input signals generated by said switching transistor.

10. The circuit of claim 9, further comprising a switching assembly for outputting the signals to the driving terminal, said switching assembly being situated between the base current generator and a base current control voltage generator.

11. The circuit of claim 9, wherein the detector comprises a transistor which is of the same type as said output transistor and is disposed in parallel with the output transistor.

12. The circuit of claim 9, wherein said current voltage converter comprises a resistor disposed in series with said reference voltage.

* * * * *